(12) United States Patent
Hsu et al.

(10) Patent No.: US 11,143,943 B2
(45) Date of Patent: Oct. 12, 2021

(54) WAVELENGTH CONVERSION ELEMENT, PROJECTION DEVICE AND MANUFACTURING METHOD OF WAVELENGTH CONVERSION ELEMENT

(71) Applicant: Coretronic Corporation, Hsin-Chu (TW)

(72) Inventors: Pi-Tsung Hsu, Hsin-Chu (TW); Chi-Tang Hsieh, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 17/079,538

(22) Filed: Oct. 26, 2020

(65) Prior Publication Data

US 2021/0132482 A1 May 6, 2021

(30) Foreign Application Priority Data

Oct. 30, 2019 (CN) .......................... 201911042604.1

(51) Int. Cl.
 *G03B 21/20* (2006.01)
(52) U.S. Cl.
 CPC .................................. *G03B 21/204* (2013.01)
(58) Field of Classification Search
 None
 See application file for complete search history.

(56) References Cited

U.S. PATENT DOCUMENTS

| 2015/0362135 A1 | 12/2015 | Sugiyama |
| 2017/0168379 A1 | 6/2017 | Hashizume |
| 2019/0041733 A1 | 2/2019 | Takagi et al. |

FOREIGN PATENT DOCUMENTS

| CN | 109073876 A | 12/2018 |
| CN | 208937892 U | 6/2019 |
| CN | 209103006 U | 7/2019 |
| JP | 2013143436 A | 7/2013 |

*Primary Examiner* — Vip Patel

(57) ABSTRACT

A wavelength conversion element includes a substrate, a wavelength conversion layer, and a first inorganic interstitial layer. The wavelength conversion layer is disposed on the substrate. The wavelength conversion layer includes an inorganic adhesive and a wavelength conversion material, and the wavelength conversion material is mixed with the inorganic adhesive. The first inorganic interstitial layer is disposed between the wavelength conversion layer and the substrate. A projection device having the wavelength conversion element is further provided, and a manufacturing method of the wavelength conversion element is also provided. The wavelength conversion element manufactured by using the manufacturing method of the invention may improve conversion efficiency and thermal conductivity. The projection device of the invention may reduce the problem that the image brightness decreases.

20 Claims, 6 Drawing Sheets

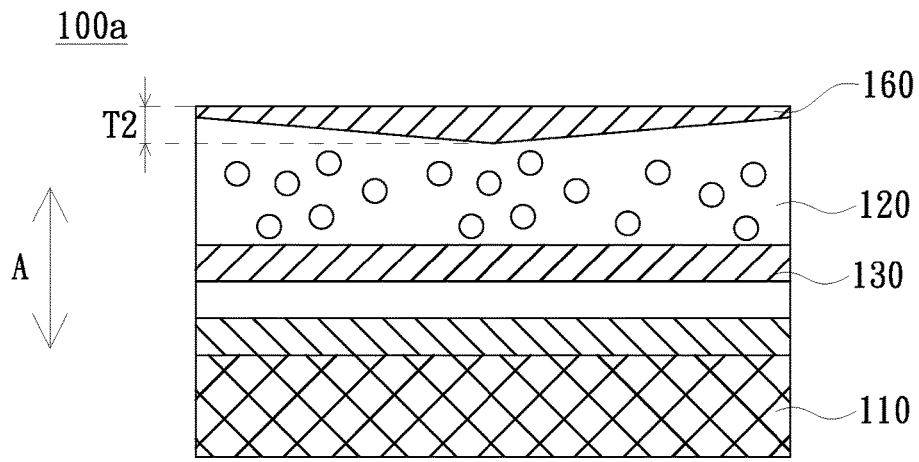

FIG. 3C

```
┌─────────────────────────────────────────────────────┐
│ Providing wavelength conversion layer, the wavelength│
│ conversion layer has first surface and second surface│─ S101
│           relative to the first surface              │
└─────────────────────────────────────────────────────┘
                          │
                          ▼
┌─────────────────────────────────────────────────────┐
│  Disposing first inorganic interstitial layer on the │
│ first surface of the wavelength conversion layer, the│
│  first inorganic interstitial layer has third surface│─ S102
│ and fourth surface relative to the third surface, and│
│     the fourth surface faces the first surface       │
└─────────────────────────────────────────────────────┘
                          │
                          ▼
┌─────────────────────────────────────────────────────┐
│   Bonding the third surface of the first inorganic   │
│  interstitial layer to substrate to dispose the first│─ S103
│   inorganic interstitial layer between the wavelength│
│          conversion layer and the substrate          │
└─────────────────────────────────────────────────────┘
```

FIG. 4

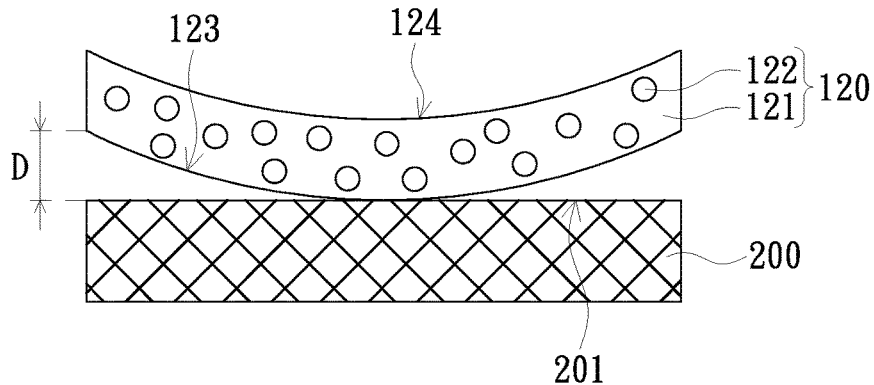

FIG. 5

| Providing wavelength conversion layer, the wavelength conversion layer has first surface and second surface relative to the first surface | ~S201 |

| Disposing first inorganic interstitial layer on the first surface of the wavelength conversion layer, the first inorganic interstitial layer has third surface and fourth surface relative to the third surface, and the fourth surface faces the first surface | ~S202 |

| Disposing second inorganic interstitial layer on the second surface of the wavelength conversion layer | ~S203 |

| Bonding the third surface of the first inorganic interstitial layer to substrate to dispose the first inorganic interstitial layer between the wavelength conversion layer and the substrate | ~S204 |

FIG. 6

WAVELENGTH CONVERSION ELEMENT, PROJECTION DEVICE AND MANUFACTURING METHOD OF WAVELENGTH CONVERSION ELEMENT

CROSS-REFERENCE TO RELATED APPLICATION

This application claims the priority benefit of China application 201911042604.1, filed on 2019 Oct. 30. The entirety of the above-mentioned patent application is hereby incorporated by reference herein and made a part of this specification.

FIELD OF THE INVENTION

The invention relates to an optical element, a manufacturing method thereof, and a display device using the optical element, and more particularly to a wavelength conversion element, a manufacturing method thereof, and a projection device using the wavelength conversion element.

BACKGROUND OF THE INVENTION

The type of light source used in the projection device has evolved from ultra-high pressure mercury lamp (UHP lamp), light emitting diode (LED) to laser diode (LD) with the market demand for brightness, color saturation, service life, non-toxic environmental protection and the like of the projection device.

At present, a cost of high-brightness red laser diodes and green laser diodes is too high. In order to reduce the cost, a blue laser diode is usually used to excite a phosphor on a phosphor wheel to generate yellow light and green light, then a desired red light is filtered through a filter wheel, and then a blue light emitted by the blue laser diode is used to form the three primary colors of red, green and blue required for a projection image.

The phosphor wheel is an extremely important element in projection devices that currently use laser diodes as a light source. However, the sintered phosphor layer of current phosphor wheels will generate pores, which affects the conversion efficiency and thermal conductivity of the phosphor wheels. In addition, due to the manufacturing process, when the phosphor layer is sintered, the two surfaces will warp due to stress imbalance, making the phosphor layer unable to fit on the wheel, which causes the conversion efficiency and thermal conductivity of the phosphor wheel to decrease.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength conversion element, which may improve conversion efficiency and thermal conductivity.

The invention provides a manufacturing method of a wavelength conversion element, which may improve conversion efficiency and thermal conductivity of the wavelength conversion element.

The invention provides a projection device, which may reduce the problem that the image brightness decreases.

Other advantages and objects of the invention may be further illustrated by the technical features broadly embodied and described as follows.

In order to achieve one or a portion of or all of the objects or other objects, a wavelength conversion element provided in an embodiment of the invention includes a substrate, a wavelength conversion layer, and a first inorganic interstitial layer. The wavelength conversion layer is disposed on the substrate. The wavelength conversion layer includes an inorganic adhesive and a wavelength conversion material, and the wavelength conversion material is mixed with the inorganic adhesive. The first inorganic interstitial layer is disposed between the wavelength conversion layer and the substrate.

In order to achieve one or a portion of or all of the objects or other objects, a projection device provided in an embodiment of the invention includes an illumination system, a light valve and a projection lens. The illumination system is adapted to provide an illumination beam. The light valve is disposed on a transmission path of the illumination beam to convert the illumination beam into an image beam. The projection lens is disposed on a transmission path of the image beam. The illumination system includes an excitation light source and the wavelength conversion element described above. The wavelength conversion element is disposed on a transmission path of an excitation beam, and the wavelength conversion element is adapted to convert the excitation beam into a converted beam, and the illumination beam includes the converted beam.

In order to achieve one or a portion of or all of the objects or other objects, a manufacturing method of a wavelength conversion element provided in an embodiment of the invention includes: Providing a wavelength conversion layer, the wavelength conversion layer has a first surface and a second surface relative to the first surface. Disposing a first inorganic interstitial layer on the first surface of the wavelength conversion layer, the first inorganic interstitial layer has a third surface and a fourth surface relative to the third surface, and the fourth surface faces the first surface. Bonding the third surface of the first inorganic interstitial layer to a substrate to dispose the first inorganic interstitial layer between the wavelength conversion layer and the substrate.

In the wavelength conversion element of the embodiment of the invention, the configuration of the first inorganic interstitial layer may reduce the pores generated during the preparation of the wavelength conversion layer, and stress may be applied to the wavelength conversion layer to reduce the warping phenomenon of the wavelength conversion layer during the preparation, thereby improving the conversion efficiency and thermal conductivity of the wavelength conversion element. In the manufacturing method of the wavelength conversion element of the embodiment of the invention, the first inorganic interstitial layer is disposed, so that the above-mentioned wavelength conversion element may be manufactured. Since the projection device of embodiment of the invention uses the above-mentioned wavelength conversion element, the problem that the image brightness decreases may be reduced.

Other objectives, features and advantages of The invention will be further understood from the further technological features disclosed by the embodiments of The invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3C are cross-sectional schematic diagrams of a wavelength conversion element of another embodiment of the invention;

FIG. 4 is a schematic flowchart of a manufacturing method of a wavelength conversion element of one embodiment of the invention;

FIG. 5 is a schematic diagram of providing a wavelength conversion layer of one embodiment of the invention;

FIG. 6 is a schematic flowchart of a manufacturing method of a wavelength conversion element of another embodiment of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing", "faces", and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

Figure 1:
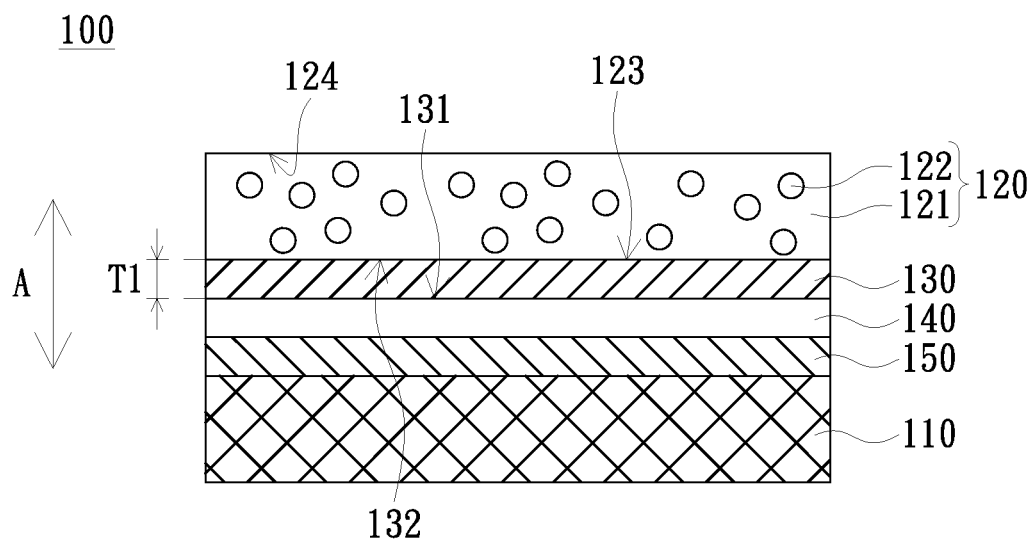
FIG. 1 is a cross-sectional schematic diagram of a wavelength conversion element of one embodiment of the invention.

FIG. 1 is a cross-sectional schematic diagram of a wavelength conversion element of one embodiment of the invention. Referring to FIG. 1, a wavelength conversion element 100 of the embodiment includes a substrate 110, a wavelength conversion layer 120, and a first inorganic interstitial layer 130. The wavelength conversion element 100 is, for example, a sheet-like element, but is not limited thereto. In other embodiments, the wavelength conversion element 100 may be a wavelength conversion wheel, and the substrate 110 is, for example, a turntable. The wavelength conversion layer 120 is disposed on the substrate 110. The wavelength conversion layer 120 includes an inorganic adhesive 121 and a wavelength conversion material 122, and the wavelength conversion material 122 is mixed with the inorganic adhesive 121. The first inorganic interstitial layer 130 is disposed between the wavelength conversion layer 120 and the substrate 110. The wavelength conversion material 122 is, for example, phosphor or quantum dot, but is not limited thereto. A material of the substrate 110 is, for example, metal, glass, or ceramic. The metal includes, for example, aluminum, aluminum alloy, copper, copper alloy, aluminum nitride, silicon carbide, and the like, and the glass surface can be plated with aluminum, silver, or electroplated film, but is not limited thereto.

A material of any one of the inorganic adhesive 121 and the first inorganic interstitial layer 130 includes, for example, at least one of alumina, silica, ceramic, and aluminum nitride, but is not limited thereto. Specifically, the material of the inorganic adhesive 121 is, for example, the same as that of the first inorganic interstitial layer 130. In another embodiment, the inorganic adhesive 121 may be made of a different material from the first inorganic interstitial layer 130.

The wavelength conversion element 100 further includes, for example, an adhesive layer 140 and a reflective layer 150. The adhesive layer 140 is disposed between the first inorganic interstitial layer 130 and the substrate 110. The reflective layer 150 is disposed between the adhesive layer 140 and the substrate 110. A material of the adhesive layer 140 includes, for example, silica gel, epoxy resin, or thermally conductive adhesive. A material of the reflection layer 150 is, for example, metal. In another embodiment, the material of the reflective layer 150 may also be a mixture of reflective particles in the adhesive, so that the reflective layer 150 may have the functions of adhesion and reflection at the same time, so there is no need to dispose the adhesive layer 140.

In the wavelength conversion element of the embodiment, the configuration of the first inorganic interstitial layer 130 may fill the pores generated during the preparation of the wavelength conversion layer 120, so that a surface flatness of the wavelength conversion layer 120 may be improved, thereby improving the conversion efficiency and thermal conductivity of the wavelength conversion element.

Figure 2A:
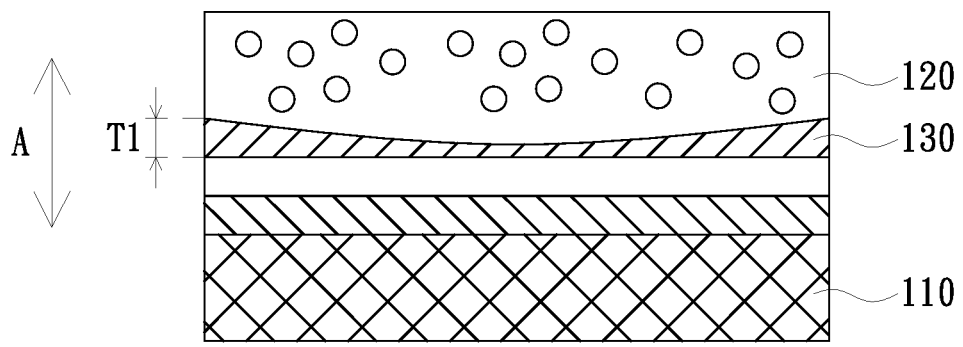
FIG. 2A and FIG. 2B are cross-sectional schematic diagrams of a wavelength conversion element of other embodiments of the invention.
Figure 2B:
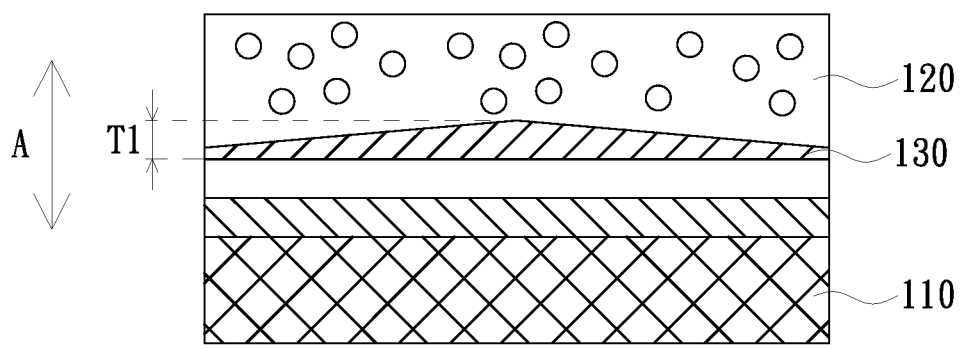

A thickness T1 of the first inorganic interstitial layer 130 in a direction A perpendicular to the substrate 110 in FIG. 1 is, for example, uniformly distributed, but is not limited thereto. In other embodiments, for example, the thickness T1 of the first inorganic interstitial layer 130 may gradually increase from a center toward an edge as shown in FIG. 2A, or decrease from the center toward the edge as shown in FIG. 2B. The thickness T1 of the first inorganic interstitial layer 130 is, for example, 1 μm~50 μm, and preferably 5 μm~20 μm. In embodiments with different thickness distributions, the thickest part of the thickness is used as the measurement basis, such as at the edge of FIG. 2A or at the center of FIG. 2B.

Figure 3A:
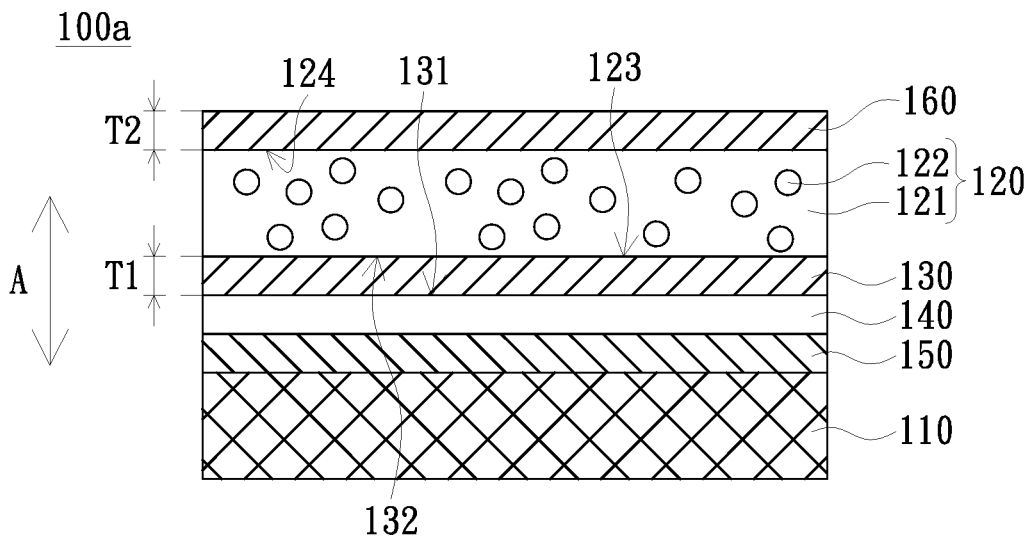
Figure 3B:
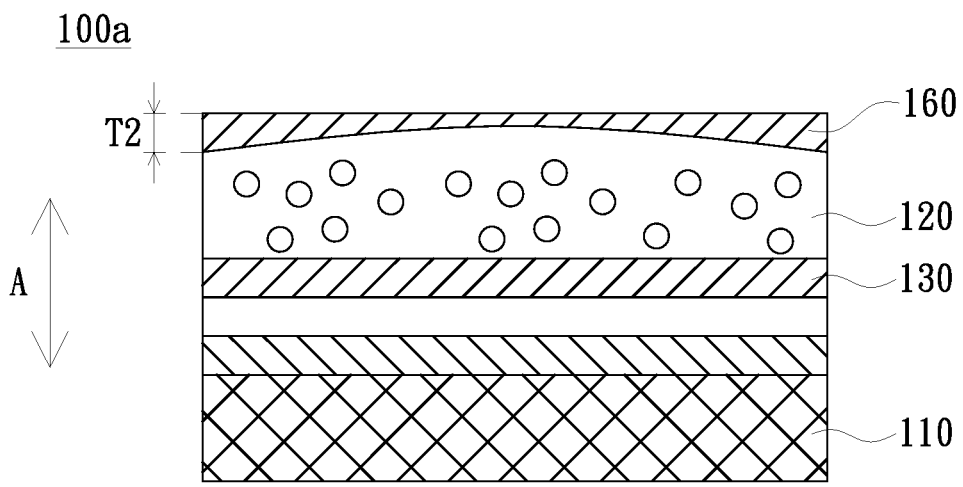

FIG. 3A to FIG. 3C are cross-sectional schematic diagrams of a wavelength conversion element of another embodiment of the invention. Referring to FIG. 3A first, the wavelength conversion element 100a of the embodiment is similar in structure and advantages to the wavelength conversion element 100, the only difference is that the wavelength conversion element 100a of the embodiment further includes a second inorganic interstitial layer 160. The wavelength conversion layer 120 is disposed between the second inorganic interstitial layer 160 and the first inorganic interstitial layer 130. A material of the second inorganic interstitial layer 160 includes, for example, at least one of alumina, silica, ceramic, and aluminum nitride, but is not limited thereto. Specifically, the material of the second inorganic interstitial layer 160 may be the same as or different from the inorganic adhesive 121 or the first inorganic interstitial layer 130, for example. The function of the second inorganic interstitial layer 160 is the same as that of the first inorganic interstitial layer 130. By disposing the second inorganic interstitial layer 160 on an upper surface and a lower surface of the wavelength conversion layer 120, the above-mentioned advantages may be further enhanced.

A thickness T2 of the second inorganic interstitial layer 160 in a direction A perpendicular to the substrate 110 in FIG. 3A is, for example, uniformly distributed, but is not limited thereto. Referring to FIG. 3B and FIG. 3C, in other embodiments, for example, the thickness T2 of the second inorganic interstitial layer 160 may gradually increase from a center toward an edge as shown in FIG. 3B, or decrease from the center toward the edge as shown in FIG. 3C. The thickness T2 of the second inorganic interstitial layer 160 is, for example, 1 μm~50 μm, and preferably 5 μm~20 μm. The thickness T1 of the first inorganic interstitial layer 130 and the thickness T2 of the second inorganic interstitial layer 160 are, for example, the same or different. The first inorganic interstitial layer 130 in FIG. 3A, FIG. 3B and FIG. 3C may also gradually increase from a center to an edge as shown in FIG. 2A, or decrease from the center to the edge as shown in FIG. 2B. That is, the thickness distribution types of the first inorganic interstitial layer 130 and the second inorganic interstitial layer 160 may be used in combination according to different design requirements. The following will describe in detail how the wavelength conversion element 100 of the embodiment reduces the warping phenomenon during the preparation.

FIG. 4 is a schematic flowchart of a manufacturing method of a wavelength conversion element of one embodiment of the invention. FIG. 5 is a schematic diagram of providing a wavelength conversion layer of one embodiment of the invention. Referring to FIG. 1 and FIG. 4 first, a manufacturing method of the wavelength conversion element 100 of the embodiment includes the following steps. Step S101: Providing a wavelength conversion layer 120, the wavelength conversion layer 120 has a first surface 123 and a second surface 124 relative to the first surface 123.

Referring to FIG. 5, specifically, the method for providing the wavelength conversion layer 120 includes: providing a preformed substrate 200 having a forming surface 201. A wavelength conversion material 122 is mixed with an inorganic adhesive 121 and coated on the forming surface 201 of the preformed substrate 200 to form a wavelength conversion layer 120. The first surface 123 of the wavelength conversion layer 120 is bonded to the forming surface 201 of the preformed substrate 200. Next, the wavelength conversion layer 120 is heated, a so-called sintering process. After sintering, the first surface 123 of the wavelength conversion layer 120 is separated from the forming surface 201 of the preformed substrate 200. During the separation process, due to factors such as a volume-concentration ratio of the wavelength conversion material 122, a precipitation of the wavelength conversion material 122 in the wavelength conversion layer 120, and a mold release from the edge of the wavelength conversion layer 120 during separation, the wavelength conversion layer 120 is warped due to a stress imbalance between the first surface 123 and the second surface 124. If the wavelength conversion layer 120 after mold release is directly bonded to the substrate 110, there will be a gap between the wavelength conversion layer 120 and the substrate 110, which will affect the conversion efficiency and thermal conductivity of the wavelength conversion element 100.

In the embodiment, by adjusting the volume-concentration ratio of the wavelength conversion material 122 contained in the wavelength conversion layer 120 to be 50% to 85%, and using the mold release agent to mold release the wavelength conversion layer 120, the stress imbalance of the first surface 123 and the second surface 124 may be reduced initially. To further reduce the degree of warping, step S102 is then performed: disposing a first inorganic interstitial layer 130 on the first surface 123 of the wavelength conversion layer 120, the first inorganic interstitial layer 130 has a third surface 131 and a fourth surface 132 relative to the third surface 131, and the fourth surface 132 faces the first surface 123.

The method of disposing the first inorganic interstitial layer 130 on the first surface 123 of the wavelength conversion layer 120 includes forming the first inorganic interstitial layer 130 on the first surface 123 of the wavelength conversion layer 120 by spraying. During the spraying process, an interstitial material used by the first inorganic interstitial layer 130 may fill the pores of the wavelength conversion layer 120, increase the density and the surface flatness of the first surface 123, and help to improve the conversion efficiency and thermal conductivity of the wavelength conversion element 100.

Further, in one embodiment, the method of disposing the first inorganic interstitial layer 130 on the first surface 123 of the wavelength conversion layer 120 further includes after forming the first inorganic interstitial layer 130 by spraying, the above-mentioned wavelength conversion layer 120 having the warping phenomenon and the first inorganic interstitial layer 130 disposed on the first surface 123 are heated and sintered, which is also the second sintering of the wavelength conversion layer 120. During the sintering process, the first inorganic interstitial layer 130 applies a stress to the wavelength conversion layer 120 that generates the warping phenomenon, so that the degree of the warping phenomenon is reduced, and the third surface 131 of the first inorganic interstitial layer 130 facing the substrate 110 may contact the substrate 110 as a whole, for example. That is, the conversion efficiency and thermal conductivity of the wavelength conversion element 100 would not be affected due to the gap between the wavelength conversion layer 120 and the substrate 110. If the degree of warping phenomenon is serious, in another embodiment, a curved substrate may also be used, and the degree of bending of the substrate 110 corresponds to the warping phenomenon of the wavelength conversion layer 120 so that the wavelength conversion layer 120 may contact the substrate 110 as a whole. In addition, in the embodiment in which other layers such as the adhesive layer 140 and the reflective layer 150 are disposed between the first inorganic interstitial layer 130 and the substrate 110, the case where the wavelength conversion layer 120 contacts the substrate 110 as a whole means that the wavelength conversion layer 120 may contact other layers such as the adhesive layer 140 or the reflective layer 150 on the substrate 110 as a whole to indicate that no gap is generated between the wavelength conversion layer 120 and the substrate 110 or the layers above it.

Depending on the degree of the warping phenomenon generated by the wavelength conversion layer 120, the first inorganic interstitial layer 130 may be selected to be disposed with different thickness distributions, for example, disposed as shown in FIG. 2A or FIG. 2B. Taking FIG. 5 as an example, the warping phenomenon of the wavelength conversion layer 120 is that the edge is warped away from the forming surface 201 of the preformed substrate 200 (warped upward), so that the thickness T1 of the first inorganic interstitial layer 130 may be disposed to gradually increase from the center to the edge as shown in FIG. 2A. Generally speaking, the first inorganic interstitial layer 130 having a thicker thickness is usually disposed in a place with a large degree of warping phenomenon, and the first inorganic interstitial layer 130 having a thinner thickness is usually disposed in a place with a small degree of warping phenomenon.

In another embodiment, the warping phenomenon may not occur in the wavelength conversion layer 120 after the first heating and sintering in step S101, but the warping phenomenon may occur in the second sintering performed in step S103. In such a situation, the thickness distribution of the first inorganic interstitial layer 130 needs to be adjusted in step S102 to reduce the degree of warping phenomenon caused by secondary sintering.

Next, step S103: bonding the third surface 131 of the first inorganic interstitial layer 130 to a substrate 110 to dispose the first inorganic interstitial layer 130 between the wavelength conversion layer 120 and the substrate 110. The method of bonding the third surface 131 of the first inorganic interstitial layer 130 to the substrate 110 to dispose the first inorganic interstitial layer 130 between the wavelength conversion layer 120 and the substrate 110 includes, for example, bonding the third surface 131 of the first inorganic interstitial layer 130 to the substrate 110 through an adhesive layer 140, but is not limited thereto. In another embodiment, for example, the first inorganic interstitial layer 130 formed by spraying and not yet heated and sintered is directly bonded to the substrate 110, and then the wavelength conversion layer 120, the first inorganic interstitial layer 130 and the substrate 110 are heated and sintered together to achieve a stable bonding effect. However, in this case, the material of the substrate 110 is preferably ceramic, which has higher temperature resistance than metal.

In the manufacturing method of the wavelength conversion element 100 of the embodiment, by disposing the first inorganic interstitial layer 130 on the first surface 123 of the wavelength conversion layer 120, the first inorganic interstitial layer 130 applies a stress to the wavelength conversion layer 120 that generates the warping phenomenon, so that the degree of the warping phenomenon is reduced, thereby improving the conversion efficiency and thermal conductivity of the wavelength conversion element 100. In the invention, the degree of warping phenomenon is defined as a spacing difference between the highest and the lowest points of the curved surface formed by bending. Taking FIG. 5 as an example, the degree of warping phenomenon of the wavelength conversion layer 120 is a spacing D difference between the edge and the center of the first surface 123. If the spacing D is larger, the degree of the warping phenomenon is higher, and vice versa. Specifically, the degree of warping phenomenon of the wavelength conversion layer when the first inorganic interstitial layer is not disposed is 0.3 mm~0.8 mm. After the first inorganic interstitial layer 130 is disposed in the wavelength conversion element 100 of the embodiment, the degree of warping phenomenon of the wavelength conversion layer 120 is reduced to 0.05 mm~0.2 mm.

FIG. 6 is a schematic flowchart of a manufacturing method of a wavelength conversion element of another embodiment of the invention. Referring to FIG. 3A and FIG. 6, a manufacturing method of the wavelength conversion element 100a of the embodiment includes the following steps. Step S201: Providing a wavelength conversion layer 120, the wavelength conversion layer 120 has a first surface 123 and a second surface 124 relative to the first surface 123. Next, step S202: disposing a first inorganic interstitial layer 130 on the first surface 123 of the wavelength conversion layer 120, the first inorganic interstitial layer 130 has a third surface 131 and a fourth surface 132 relative to the third surface 131, and the fourth surface 132 faces the first surface 123. Steps S201 and S202 are the same as steps S101 and S102 in the manufacturing method of the wavelength conversion element 100, and will not be repeated hereinafter.

Next, step S203: disposing a second inorganic interstitial layer 160 on the second surface 124 of the wavelength conversion layer 120. The second inorganic interstitial layer 160 is, for example, also formed on the second surface 124 of the wavelength conversion layer 120 by spraying. In addition, the second inorganic interstitial layer 160 may also be disposed with different thickness distributions like the first inorganic interstitial layer 130, for example, in the manner shown in FIG. 3B or FIG. 3C. The thickness distribution types of the first inorganic interstitial layer 130 and the second inorganic interstitial layer 160 may be used in combination according to different design requirements, and the invention is not particularly limited. After step S203, step S204 is performed: bonding the third surface 131 of the first inorganic interstitial layer 130 to a substrate 110 to dispose the first inorganic interstitial layer 130 between the wavelength conversion layer 120 and the substrate 110.

Figure 7:
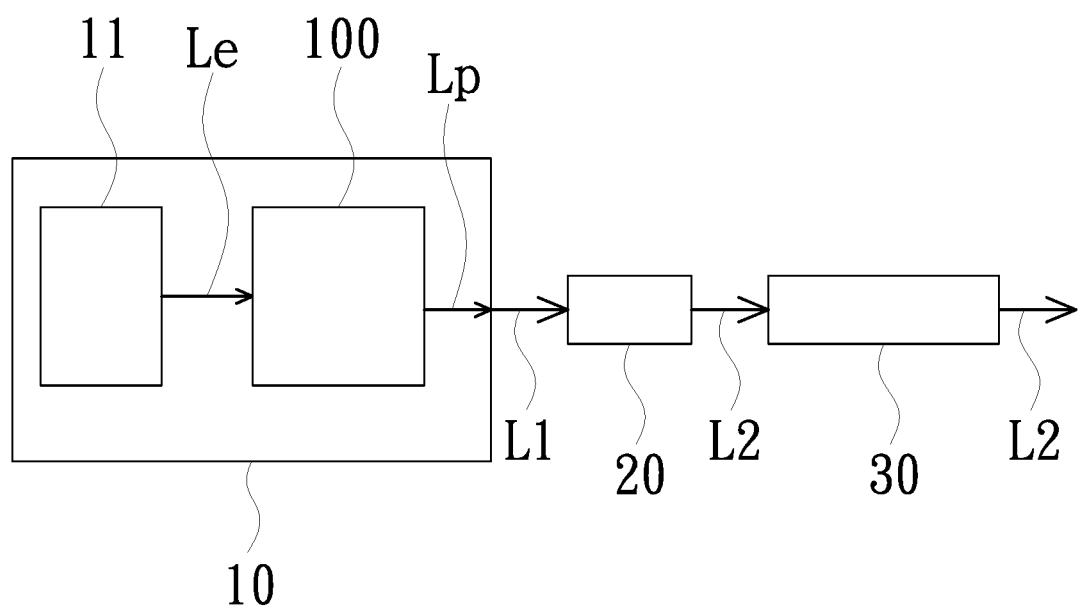
FIG. 7 is a block diagram of a projection device of one embodiment of the invention.

FIG. 7 is a block diagram of a projection device of one embodiment of the invention. Referring to FIG. 7, in the embodiment, the above-mentioned wavelength conversion element 100 is, for example, a wavelength conversion wheel, and the substrate 110 is, for example, a turntable. A projection device 1 of the embodiment includes an illumination system 10, a light valve 20 and a projection lens 30. The illumination system 10 is adapted to provide an illumination beam L1. The illumination system 10 includes an excitation light source 11 and the wavelength conversion element 100. The excitation light source 11 is, for example, a diode module including a light emitting diode or a laser diode chip or a matrix composed of a plurality of diode modules to provide the excitation beam Le, but is not limited thereto. The wavelength conversion element 100 is disposed on a transmission path of the excitation light beam Le and includes a wavelength conversion region (not shown). The wavelength conversion region includes the wavelength conversion layer 120 and the reflective layer 150. The wavelength conversion region of the wavelength conversion element 100 is adapted to convert the excitation beam Le into a converted beam Lp, and the illumination beam L1 includes the converted beam Lp, but is not limited thereto. The illumination system 10 may further include other optical elements, such as a light combining element, a color wheel, a light homogenization element, and a condensing lens, so that the illumination beam L1 may be transmitted to the light valve 20. The light valve 20 is disposed on the transmission path of the illumination beam L1 to convert the illumination beam L1 into an image beam L2. Depending on the design architecture, the quantity of light valve may be one or more. The projection lens 30 is disposed on the transmission path of the image beam L2 and is adapted to project the image beam L2 out of the projection device 1.

The light valve 20 may be a reflective light valve or a transmissive light valve, in which the reflective light valve may be a digital micro-mirror device (DMD), a liquid crystal display (LCD), a liquid crystal on silicon panel (LCoS panel), a transparent liquid crystal panel, an electro-optical modulator, a magneto-optic modulator, an acousto-optic modulator (AOM), and the transmissive light valve may be a transmissive liquid crystal panel, but is not limited thereto.

The projection lens 30 includes, for example, a combination of one or more optical lenses having diopter, such as various combinations of non-planar lenses including biconcave lenses, lenticular lenses, meniscus lenses, convex and concave lenses, plano-convex lenses, and plano-concave lenses. In one embodiment, the projection lens 30 may also include a planar optical lens. The invention does not limit the type and kind of the projection lens 30.

In FIG. 7, the wavelength conversion element 100 of FIG. 1 is taken as an example, but the wavelength conversion element 100 may be replaced with the wavelength conversion element of any of the above embodiments.

Since the projection device 1 of the embodiment uses the wavelength conversion elements 100, 100a capable of improving the conversion efficiency, the image brightness may be improved. For example, the wavelength conversion element 100 disposed with the first inorganic interstitial layer 130 of the embodiment of the invention and the current wavelength conversion element without the first inorganic interstitial layer 130 are measured by integrating sphere brightness, the wavelength conversion element 100 of the embodiment of the invention may improve the brightness by 2% to 5% compared with the current wavelength conversion element.

In summary, in the wavelength conversion element of the embodiment of the invention, the configuration of the first inorganic interstitial layer may reduce the pores generated during the preparation of the wavelength conversion layer, and stress may be applied to the wavelength conversion layer to reduce the warping phenomenon of the wavelength conversion layer during the preparation, thereby improving the conversion efficiency and thermal conductivity of the wavelength conversion element. In the manufacturing method of the wavelength conversion element of the embodiment of the invention, the first inorganic interstitial layer is disposed, so that the above-mentioned wavelength conversion element may be manufactured. Since the projection device of embodiment of the invention uses the above-mentioned wavelength conversion element, the problem that the image brightness decreases may be reduced.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims. Furthermore, the terms such as the first inorganic interstitial layer, the second inorganic interstitial layer, the first surface, the second surface, the third surface and the fourth surface are only used for distinguishing various elements and do not limit the number of the elements.

What is claimed is:

1. A wavelength conversion element, comprising:
   a substrate;
   a wavelength conversion layer, disposed on the substrate, wherein the wavelength conversion layer includes an inorganic adhesive and a wavelength conversion material, and the wavelength conversion material is mixed with the inorganic adhesive; and
   a first inorganic interstitial layer, disposed between the wavelength conversion layer and the substrate.

2. The wavelength conversion element according to claim 1, wherein a material of any one of the inorganic adhesive and the first inorganic interstitial layer comprises at least one of alumina, silica, ceramic, and aluminum nitride.

3. The wavelength conversion element according to claim 1, further comprising a second inorganic interstitial layer, wherein the wavelength conversion layer is disposed between the second inorganic interstitial layer and the first inorganic interstitial layer.

4. The wavelength conversion element according to claim 3, wherein a material of the second inorganic interstitial layer comprises at least one of alumina, silica, ceramic, and aluminum nitride.

5. The wavelength conversion element according to claim 3, wherein a thickness of the second inorganic interstitial layer in a direction perpendicular to the substrate is 1 μm~50 μm.

6. The wavelength conversion element according to claim 3, wherein a thickness of the first inorganic interstitial layer and a thickness of the second inorganic interstitial layer in a direction perpendicular to the substrate are the same or different.

7. The wavelength conversion element according to claim 3, wherein a thickness of the second inorganic interstitial layer in a direction perpendicular to the substrate is uniformly distributed, increasing from a center toward an edge, or decreasing from a center toward an edge.

8. The wavelength conversion element according to claim 1, further comprising an adhesive layer, disposed between the first inorganic interstitial layer and the substrate.

9. The wavelength conversion element according to claim 1, wherein a volume-concentration ratio of the wavelength conversion material contained in the wavelength conversion layer is 50% to 85%.

10. The wavelength conversion element according to claim 1, wherein a thickness of the first inorganic interstitial layer in a direction perpendicular to the substrate is 1 μm~50 μm.

11. The wavelength conversion element according to claim 1, wherein a thickness of the first inorganic interstitial layer in a direction perpendicular to the substrate is uniformly distributed, increasing from a center toward an edge, or decreasing from a center toward an edge.

12. The wavelength conversion element according to claim 1, wherein a surface of the first inorganic interstitial layer facing the substrate contacts the substrate as a whole.

13. A projection device, comprising:
an illumination system, adapted to provide an illumination beam;
a light valve, disposed on a transmission path of the illumination beam to convert the illumination beam into an image beam; and
a projection lens, disposed on a transmission path of the image beam,
wherein the illumination system comprises an excitation light source and a wavelength conversion element, the excitation light source is adapted to provide an excitation beam, the wavelength conversion element is disposed on a transmission path of the excitation beam, and the wavelength conversion element is adapted to convert the excitation beam into a converted beam, and the illumination beam includes the converted beam, the wavelength conversion element comprising:
a substrate;
a wavelength conversion layer, disposed on the substrate, wherein the wavelength conversion layer includes an inorganic adhesive and a wavelength conversion material, and the wavelength conversion material is mixed with the inorganic adhesive; and
a first inorganic interstitial layer, disposed between the wavelength conversion layer and the substrate.

14. A manufacturing method of a wavelength conversion element, comprising:
providing a wavelength conversion layer, the wavelength conversion layer has a first surface and a second surface relative to the first surface;
disposing a first inorganic interstitial layer on the first surface of the wavelength conversion layer, the first inorganic interstitial layer has a third surface and a fourth surface relative to the third surface, and the fourth surface faces the first surface; and
bonding the third surface of the first inorganic interstitial layer to a substrate to dispose the first inorganic interstitial layer between the wavelength conversion layer and the substrate.

15. The manufacturing method of a wavelength conversion element according to claim 14, wherein the method of providing a wavelength conversion layer comprises:
providing a preformed substrate having a forming surface;
mixing a wavelength conversion material with an inorganic adhesive and coating on the forming surface of the preformed substrate to form a wavelength conversion layer, and bonding the first surface of the wavelength conversion layer to the forming surface of the preformed substrate;
heating the wavelength conversion layer; and
separating the first surface of the wavelength conversion layer from the forming surface of the preformed substrate.

16. The manufacturing method of a wavelength conversion element according to claim 14, wherein the method of disposing the first inorganic interstitial layer on the first surface of the wavelength conversion layer comprises forming the first inorganic interstitial layer on the first surface of the wavelength conversion layer by spraying.

17. The manufacturing method of a wavelength conversion element according to claim 14, wherein the method of disposing the first inorganic interstitial layer on the first surface of the wavelength conversion layer comprises heating the wavelength conversion layer and the first inorganic interstitial layer.

18. The manufacturing method of a wavelength conversion element according to claim 14, wherein the method of bonding the third surface of the first inorganic interstitial layer to the substrate to dispose the first inorganic interstitial layer between the wavelength conversion layer and the substrate comprises bonding the third surface of the first inorganic interstitial layer to the substrate through an adhesive layer.

19. The manufacturing method of a wavelength conversion element according to claim 14, wherein the method of bonding the third surface of the first inorganic interstitial layer to the substrate to dispose the first inorganic interstitial layer between the wavelength conversion layer and the substrate comprises heating the wavelength conversion layer, the first inorganic interstitial layer and the substrate.

20. The manufacturing method of a wavelength conversion element according to claim 14, wherein before bonding the third surface of the first inorganic interstitial layer to the substrate to dispose the first inorganic interstitial layer between the wavelength conversion layer and the substrate, the manufacturing method of the wavelength conversion element further comprises disposing a second inorganic interstitial layer on the second surface of the wavelength conversion layer.

* * * * *